United States Patent
Muraoka (10) Patent No.: US 7,597,933 B2
(45) Date of Patent: Oct. 6, 2009

(54) METHOD OF PREPARING PRINTED OR DAUBED IMAGE AND PRINTED OR DAUBED IMAGE ELEMENT BY IT

(75) Inventor: Kouji Muraoka, Sabae (JP)

(73) Assignee: Shuhou Co., Ltd., Fuki-Shi (JP)

( * ) Notice: Subject to any disclaimer, the term of this patent is extended or adjusted under 35 U.S.C. 154(b) by 474 days.

(21) Appl. No.: 10/568,629

(22) PCT Filed: Aug. 21, 2003

(86) PCT No.: PCT/JP03/10561

§ 371 (c)(1),
(2), (4) Date: Sep. 28, 2006

(87) PCT Pub. No.: WO2005/019504

PCT Pub. Date: Mar. 3, 2005

(65) Prior Publication Data

US 2007/0144913 A1 Jun. 28, 2007

(51) Int. Cl.
*B05D 5/00* (2006.01)
(52) U.S. Cl. .................................................. 427/256
(58) Field of Classification Search ................ 427/256, 427/58, 60, 96.1
See application file for complete search history.

(56) References Cited

FOREIGN PATENT DOCUMENTS

| JP | 60-26694 A | 2/1985 |
|----|------------|--------|
| JP | 1-132794 A | 5/1989 |
| JP | 50-56331 A | 5/1995 |
| JP | 8-127894 A | 5/1996 |
| JP | 2003-306792 | 10/2003 |
| JP | 2004-358863 | 12/2004 |

OTHER PUBLICATIONS

Patent Abstracts of Japan of JP 2003-306792 dated Oct. 31, 2003.
Patent Abstracts of Japan of JP 2004-358863 dated Dec. 24, 2004.
English Patent Abstract of Japan 08-127894 Published May 21, 1996.
English Patent Abstract of Japan 01-132794 Published May 25, 1989.
English Patent Abstract of Japan 60-026694 Published Feb. 9, 1985.
English Patent Abstract of Japan 50-56331 Published May 17, 1985.

*Primary Examiner*—Roberts Culbert
(74) *Attorney, Agent, or Firm*—Ladas and Parry LLP (57) ABSTRACT

A method for creating a print or coating image, characterized by including a first step of printing or coating a surface of a to-be-printed or to-be-coated product with a predetermined print or coating image using a mixture fluid in which predetermined powder has been mixed into printing ink or paint, a second step of pressure-treating and/or polishing at least the printed or coated print or coating image surface in predetermined conditions, and a third step of further plating the pressure-treated and/or polished print or coating image surface, or including a first step of printing or coating a surface of a to-be-printed or to-be-coated product with a predetermined print or coating using printing ink or paint, a second step of spraying the printed or coated surface with predetermined powder before the printed or coated surface is hardened, a third step of further pressure/compression-treating the print or coating image surface, a fourth step of drying and fixing the print or coating image surface, a fifth step of polishing the print or coating image surface in predetermined conditions, and a sixth step of further plating the polished print or coating image surface; and a product with an image created by the method.

8 Claims, 9 Drawing Sheets

METHOD OF PREPARING PRINTED OR DAUBED IMAGE AND PRINTED OR DAUBED IMAGE ELEMENT BY IT

TECHNICAL FIELD

The present invention relates to a method for creating a print or coating image and a body with a print or coating image using the method.

BACKGROUND ART

A large number of plastics are often used in any field in the world currently. Plastics are expected to replace metal as materials in more fields also in the future. In addition, brand marks, maker marks, various patterns, etc. are indicated in most of plastic products including IC apparatus such as cellular phones, personal computers, TV sets and digital cameras, household products such as eating utensils and stationery products, and the like. Particularly, indication marks using a printing method or a plating method are preferred because there is no feeling of mismatching with bodies, differently from attached labels or the like.

Particularly, indication marks, patterns, etc. using metal plating of gold, silver or the like, can provide a sense of luxury together with a feeling of graceful depth so as to improve the values of products. Such indication marks, patterns, etc. can be regarded as youth orientation.

It is, however, difficult to electroplate plastic with metal. A special conductive plastic material such as polyacethylene using $AsF_5$ or the like as dopant may be used as a material instead of metal. Alternatively, a vapor deposition method may be used, or an electroless plating method or the like may be used. However, the material is restricted because heat not lower than 80° C. is applied to the material. At any rate, it has been inevitable to depend on an expensive and complicated technique.

In addition, most products are often arranged by a combination of curved surfaces due to aesthetic sense. It is not always impossible to perform plating upon these surfaces, but a considerably complicated and advanced technique is required technically. Thus, the products have been expensive due to their manufacturing cost. In addition, there has been a tendency that the outline of an obtained indication mark or pattern is not always clear.

Further, in applications to casings of computer apparatuses, electronic image display screens, etc., not only is it expected to display beautiful indication marks or images but it is also often expected to provide an effect of shielding required portions from electromagnetic waves. In the background art, electromagnetic wave shielding means are often implemented by means of covering the whole of the casing with an electromagnetic wave shielding material in a vapor deposition method or the like. The means has been regarded as unsatisfactory in regard to the cost.

In addition, direct drawing with an electron beam has been used in microscopic electric circuits such as IC devices in recent years. Further, a method in which an electric circuit is arranged directly out of conductive printing ink has been also investigated. The content of conductive powder to provide conductivity, for example, the content of Ag powder has to satisfy not only the condition that it should provide a function of having good conductivity as an essential function but also the condition that it must not give any damage to the printing characteristic as printing ink. These two conditions are, however, contrary to each other.

In order not to spoil this printing characteristic, the content of the conductive powder is limited up to 20-30%. This does not always satisfy the condition for obtaining good conductivity. In addition, when the printed line width is shorter than 10 μm, the absolute value of power particle density itself becomes too small to expect good conductivity. Therefore, an electric circuit having good conductivity by a printing method has been desired strongly.

As described above, it is strongly requested to attach various indication marks, images, etc. by plating or the like comparatively inexpensively on the surface of a product to be printed or coated by use of a printing method. In addition, a means for providing an electromagnetic wave shielding effect in a required portion inexpensively is also highly requested. Further, it is strongly desired to produce a microscopic electric circuit having good conductivity by use of a printing method desired in regard to cost.

In consideration of the aforementioned requests, an object of the present invention is to provide plating of an image or the like or a microscopic electric circuit surely and inexpensively on the surface of a product to be printed or coated by use of a printing method. In addition, another object of the invention is to provide a means for applying an electromagnetic wave shielding effect to a required portion comparatively inexpensively.

DISCLOSURE OF THE INVENTION

A print or coating image creating method according to the present invention includes:

1) A method for creating a print or coating image on a surface of a to-be-printed or to-be-coated product, including a first step of printing or coating the surface of the to-be-printed or to-be-coated product with a predetermined print or coating image using a mixture fluid in which predetermined powder has been mixed into printing ink or paint, a second step of pressure-treating and/or polishing at least the printed or coated print or coating image surface in predetermined conditions, and a third step of further plating the pressure-treated and/or polished print or coating image surface.

2) A method for creating a print or coating image on a surface of a to-be-printed or to-be-coated product, including a first step of printing or coating the surface of the to-be-printed or to-be-coated product with a predetermined print or coating using printing ink or paint, a second step of spraying the printed or coated surface with predetermined powder before the printed or coated surface is hardened, a third step of further pressure/compression-treating the print or coating image surface, a fourth step of drying and fixing the print or coating image surface, a fifth step of polishing the print or coating image surface in predetermined conditions, and a sixth step of further plating the polished print or coating image surface.

3) In the aforementioned paragraph 1) or 2), the predetermined powder is made of at least one kind of conductive powder, magnetic powder, luminous powder and pearl-like powder;

4) In the aforementioned paragraph 1) or 2), the predetermined powder is made of at least one kind selected from a group of Ti, Cu, Fe, Ni, Mg, C, Pd, Ag and Au or a group of compounds of those, and an average grain size of the predetermined powder is 0.5-10 μm;

5) In any one of the aforementioned paragraphs 1) through 4), the plating is electrolytic plating, or electroless plating and electrolytic plating;

6) In the aforementioned paragraph 1), 2) or 4), the plating is plating with at least one kind selected from Au, Ag, Ni, Pd, Cu and alloys of those, and thickness of the plating is 0.2-50 μm;

7) In any one of the aforementioned paragraphs 1) through 6), the polishing is performed enough times to generate a gloss in the surface with a surface pressure of 20-100 g/cm² and an average polishing speed of 5-20 m/min and by use of sponge, felt, cotton cloth or leather as the predetermined conditions of the polishing; and 8) In any one of the aforementioned 1) through 7), the to-be-printed or to-be-coated product is made of plastics, ceramics, semiconductor, fiber or paper.

In addition, a print or coating image body according to the present invention is characterized in that:

9) the print or coating image body with a print or coating image created according to any one of the aforementioned paragraphs 1) through 8) is a plastic product;

10) the print or coating image body with a print or coating image created according to any one of the aforementioned paragraphs 1) through 8) is a casing or an electronic image display screen of a computer apparatus;

11) the print or coating image body with a print or coating image created according to any one of the aforementioned paragraphs 1) through 8) is an eyeglass frame;

12) the print or coating image body with a print or coating image created according to any one of the aforementioned paragraphs 1) through 8) is an accessory; or 13) the print or coating image body with a print or coating image created according to any one of the aforementioned paragraphs 1) through 8) is a toy.

Further, a print or coating image body according to the present invention is characterized in that:

14) the print or coating image body with a print or coating image created according to any one of the aforementioned paragraphs 1) through 8) is an IC (Integrated Circuit) device;

15) the print or coating image body with a print or coating image created according to any one of the aforementioned paragraphs 1) through 8) is a glass product;

16) the print or coating image body with a print or coating image created according to any one of the aforementioned paragraphs 1) through 8) is a woven fabric product; or 17) the print or coating image body with a print or coating image created according to any one of the aforementioned paragraphs 1) through 8) is a paper sheet product.

BRIEF DESCRIPTION OF THE DRAWINGS

FIGS. 11(*a*) and 11(*b*) are an explanatory view of a top of a specimen to which a print image has been applied according to Embodiment 5 of the present invention, and a partially enlarged explanatory view of the print image, respectively.

BEST MODE FOR CARRYING OUT THE INVENTION

Figure 1:
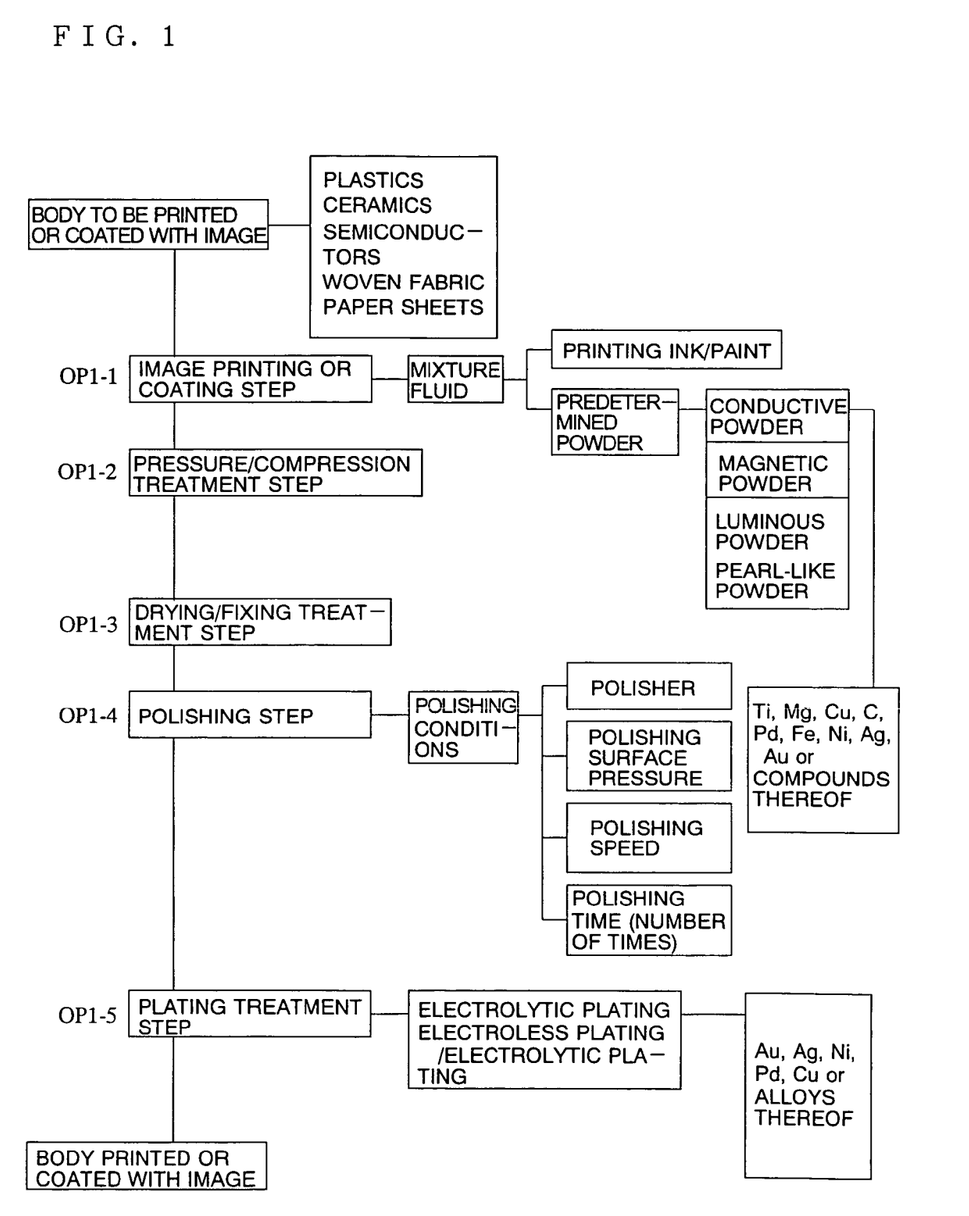
FIG. 1 is a flow chart showing Embodiment 1 of a method for creating a print or coating image on a plastic according to the present invention.

The present invention will be described more in detail with reference to the accompanying drawings. FIG. 1 is a flow chart showing Embodiment 1 of a method for creating a print or coating image according to the present invention.

That is, a first step (OP1-1) is a step in which an indication mark, a pattern or the like is printed on a predetermined portion of a plastic molded product molded out of a usual molding raw material, in a relief printing method, a screen printing method or the like using a pattern drawn in advance as a master. The surface to be printed thereon is not always a flat surface but may be a curved surface. In this case, it is possible to apply a curved surface printing method based on Japanese Patent Laid-Open No. 239972/1990 "Method and Apparatus for Printing on Curved Surface" filed by the applicant of the present invention, or the like.

Printing ink or paint to be used is a usually used one, and conductive powder chiefly made of metal powder is mixed into this. A mixture fluid prepared thus is used. It is desired that the conductive powder contains at least one kind selected from a group of Ti, Cu, Fe, Ni, Mg, C, Pd, Ag and Au, and the average grain size thereof is 0.5-10 µm. As for the amount of the conductive powder to be mixed into the printing ink or paint, it is important to mix about 30-70 vol % with respect to 100 vol % of the printing ink or paint, and stir and disperse it sufficiently.

When the mixing ratio of the conductive powder is lower than 30 vol %, it will be impossible to perform metal plating in a subsequent step. On the contrary, when the mixing ratio is higher than 70 vol %, the printing performance of the mixed printing ink will deteriorate extremely, unpreferably. On the other hand, it is desired that the average grain size of the conductive power is 0.5-10 µm. With reduction in grain size, the conductivity is improved. However, when the average grain size is not higher than 0.5 µm, it will be difficult to produce the conductive powder. On the contrary, when the average grain size is not lower than 10 µm, the printing performance, particularly the thin-line printing accuracy will deteriorate, unpreferably.

The powder is not always limited to metal powder. However, metal powder is preferred due to its conductive performance and availability. Particularly when metal powder mixed with Ag or Pd powder is used, it is possible to easily obtain conductivity desired in subsequent steps. When Cu or Fe powder is used, it is desired to add an additive such as organic acid to thereby activate the surface in order to avoid lowering of the conductivity due to an oxide layer of the powder.

In a second step (OP1-2), the surface of the print image which has been printed on the flat surface or the curved surface of the plastic molded product as described above is pressure/compression-treated by a roller made of PTFE or the like. Due to this step, the contact ratio among the conductive particles is enhanced so that the conductivity is improved. The pressure/compression conditions are set desirably by the average grain size and the mixing ratio. It is desired to select the pressure/compression conditions so as to increase the compression load within a range not to disturb the print image.

A drying treatment step as a third step (OP1-3) is applied to the plastic molded product subjected to the pressure/compression treatment so as to fix the print image. Drying is performed by usual hot-air drying, UV drying, or the like.

The next fourth step (OP1-4) is a step essential to the present invention, which is a step of polishing the aforementioned print image surface in predetermined conditions.

An object of the polishing is to improve the surface roughness as a plating base without lowering the contact ratio among the conductive particles in order to obtain a good glossy surface of a plated surface when the printed print image is plated with metal. A treating method such as grinding or buffing of the print image surface may generate abrasion dust from the powder to be treated. Accordingly, such a method is not used, but only the surface roughness should be improved without generating abrasion dust from the powder. Differently from a metal surface, there is a key point in that the target is a soft print image surface. As a result of polishing, a virgin surface of the powder appears in the surface so that the catalyst function and the surface conductivity are improved to make plating easier.

That is, according to the present invention, sponge, felt, cotton cloth or leather is used as polisher. Particularly, it is more preferable to use sponge. In addition, as for the polishing conditions, there is an application limit in the conditions where the polishing surface pressure is about 20-100 g/cm$^2$ and the polishing average speed is about 5-20 m/min. More preferably, the polishing surface pressure is 20-50 g/cm$^2$ and the polishing average speed is 10-20 m/min. Most preferably, the polishing surface pressure is 30-40 g/cm$^2$ and the polishing average speed is 10-15 m/min.

Not to say, the polishing conditions can be selected desirably in accordance with the conditions (average grain size, mixing ratio, hardness, and adhesion force) of the print image to be polished. At any rate, it is necessary to perform polishing till the polished surface shows a dull glossy surface. It is preferable that the surface roughness (Hmax) of the print image surface after polishing is about 0.5-2 μm.

Although the step of performing polishing treatment after the pressure treatment has been described above, either the pressure treatment or the polishing treatment may be omitted in some conditions of the power grains (average grain'size, material, loading, etc.) or the conditions of the printing ink or paint (material, viscosity, wettability, etc.).

A fifth step (OP1-5) is a plating step of substantially expressing an indication mark or pattern.

Electrolytic plating with a material chiefly selected from a group of Au, Ag, Ni, Pd, Cu and alloys of these is performed upon the print image subjected to the aforementioned polishing step. Usual plating conditions can be applied using the print image surface as a cathode. A plated surface obtained thus is not a usual plated surface but a moderately glossy plated surface.

Figure 2:
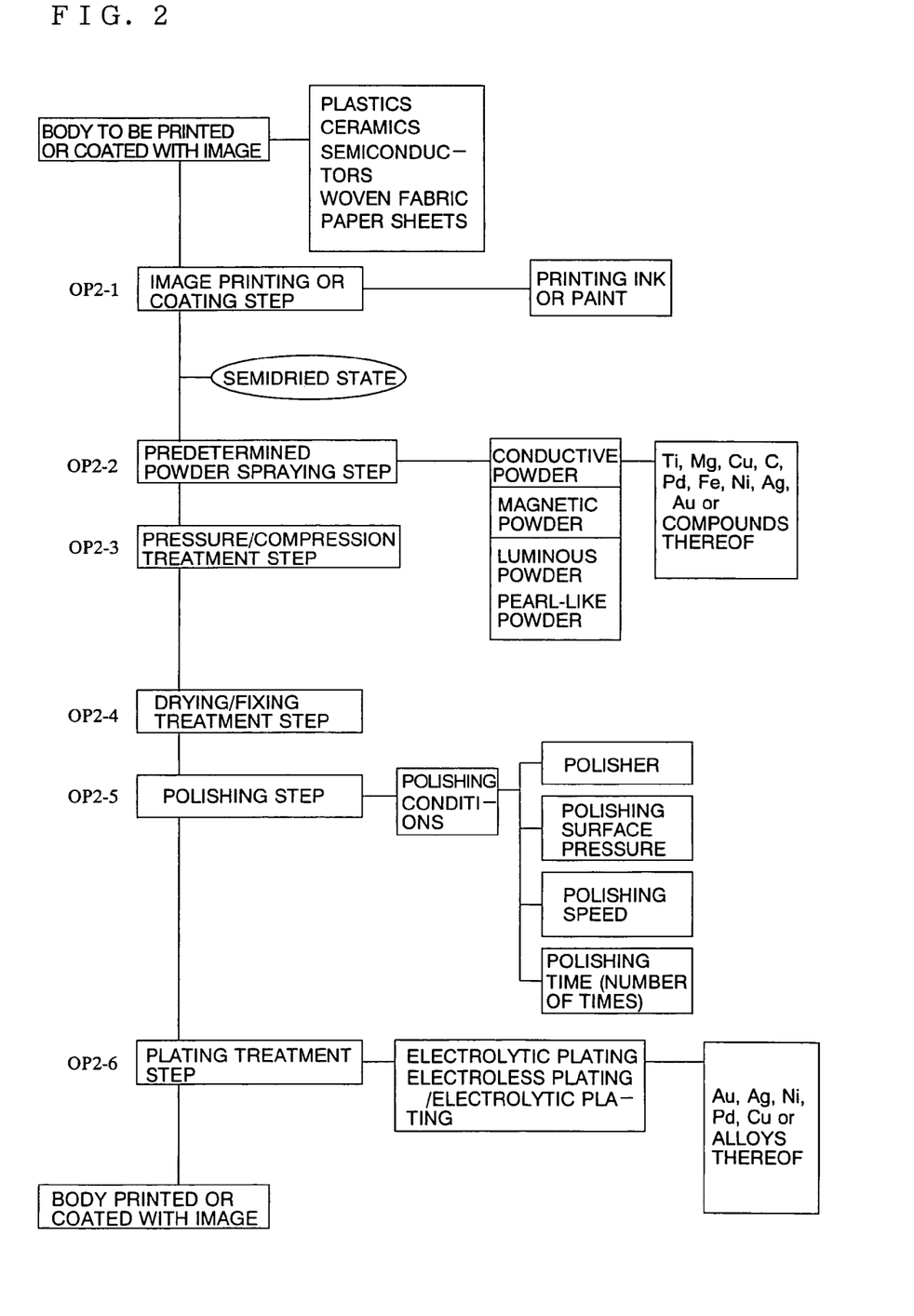
FIG. 2 is a flow chart showing Embodiment 2 of a method for creating a print or coating image on a plastic according to the present invention.

FIG. 2 is a flow chart showing a second embodiment of a method for creating a print or coating image according to the present invention.

There is a different point from the flow of FIG. 1 in steps OP2-1 to OP2-4. First, printing, or coating the to-be-printed or to-be-coated image body with an indication mark or image in the first step (OP2-1) is performed using a usual standard printing ink or paint. However, differently from the case of printing or paint with the mixture fluid in FIG. 1, the printing ink or paint itself is required to have an effect as adhesive. Accordingly, there is an advantage that more excellent printing can be performed regardless of the properties of printing depending on the power content of the mixture fluid with the conductive powder mixed therein as described previously.

In the second step (OP2-2), conductive powder is sprayed uniformly on the print or coating image surface in a shifter method or in a blasting method in the state where the printed or coated print or coating image is semidried (half-dried), that is, still has an adhesion force.

The conductive powder to be sprayed has fundamentally the same specification as the conductive powder mixed into the printing ink or paint in the aforementioned step OP1-1.

However, the distribution quantity of the powder sprayed and fixed onto the print or coating image surface can be made much larger than that in the step of the previous embodiment (FIG. 1).

In the third step (OP2-3), pressure/compression treatment is performed upon the aforementioned print or coating image surface by a roller made of PTFE or the like. The pressure/compression conditions can be set desirably by the average grain size and the mixing ratio. It is desired to select the pressure/compression conditions so as to increase the compression load within a range not to disturb the print or coating image. This is the same as the case in the previous embodiment. Due to the step, the contact ratio among the conductive particles is enhanced so that the conductivity is improved.

In the fourth step (OP2-4), a heating/drying treatment is performed upon the pressure/compression-treated print or coating image surface. Due to this step, the conductive powder is sufficiently fixed onto the body printed or coated with the image. Drying is performed by usual hot-air drying, UV drying, or the like.

In the fifth step (OP2-5), polishing is performed upon the aforementioned print or coating image surface. Since the surface distribution density of the conductive powder is higher than that in the previous embodiments it is preferable to use felt or leather rather than sponge as a polisher.

In the same manner as described above, the polishing conditions can be selected desirably in accordance with the conditions (average grain size, mixing ratio, hardness, and adhesion force) of the print or coating image to be polished. At any rate, it is necessary to perform polishing till the polished surface shows a dull glossy surface.

It is preferable that the surface roughness (Hmax) of the print or coating image surface after polishing is about 0.5-2 μm.

Next, in the sixth step (OP2-6), metal electrolytic plating is performed upon the surface of the aforementioned print or coating image so that an indication mark or image can be expressed as a glossy plated surface.

The kind of the metal plating is selected from plating with Au, Ag, Ni, Pd or a Cu alloy based on the color and design specification of the body to be printed or coated with the image. The thickness of the metal electrolytic plating is about 0.5-30 μm.

Figure 3:
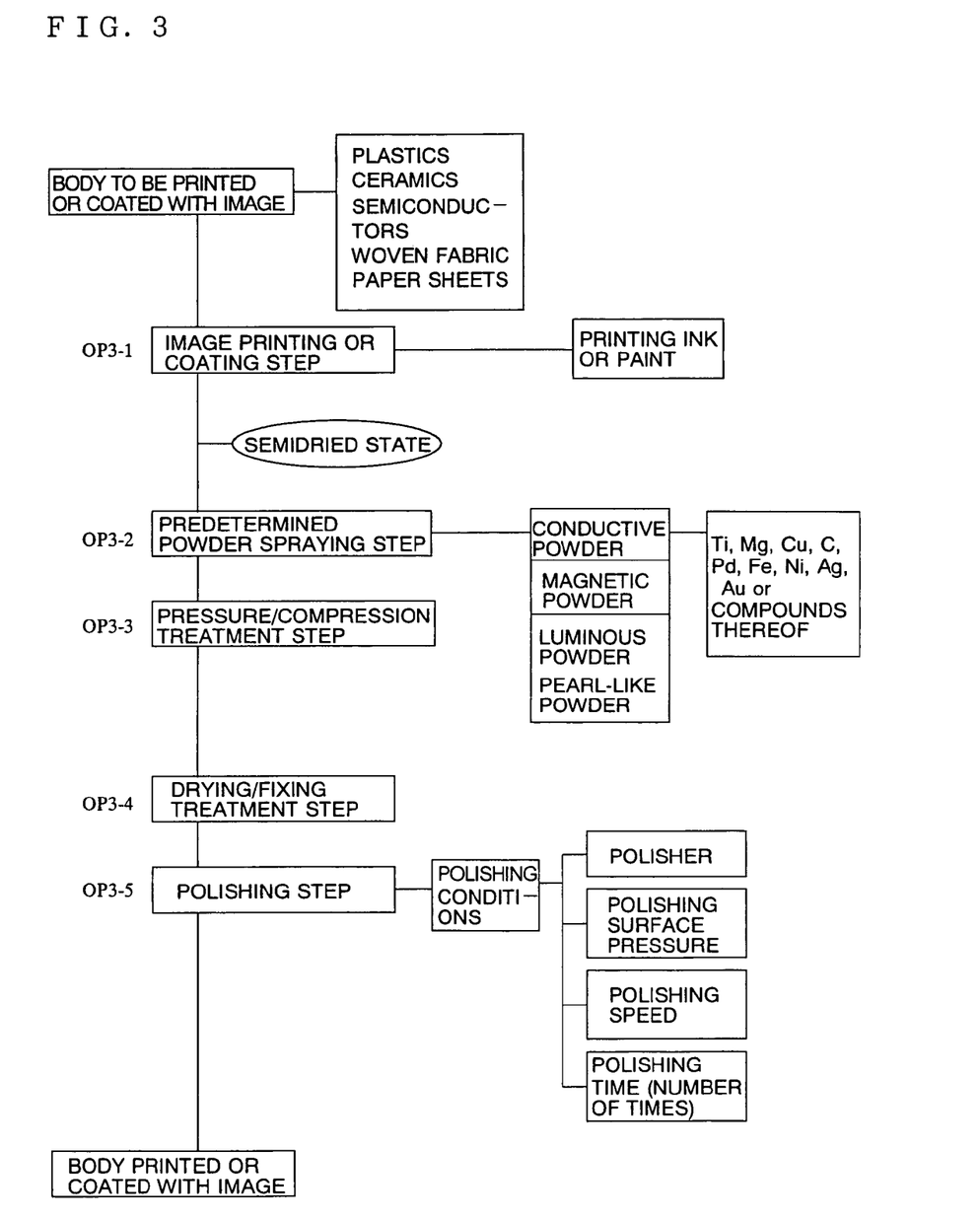
FIG. 3 is a flow chart showing Embodiment 3 of a method for creating a print or coating image on a plastic according to the present invention.

FIG. 3 is a flow chart showing a third embodiment of a method for creating a print or coating image according to the present invention.

This flow is characterized in that the plating step is omitted from the aforementioned flow in FIG. 2.

In addition, powder to be sprayed in a powder spraying step (OP3-2) is powder keeping a final aesthetic form. The powder is Au powder, Ag powder, Ni powder, Pd powder, Cu alloy powder, pearl-like powder or luminous powder. Here, the pearl-like powder means a lame-like powder such as pearl powder, shell endothelial powder, epidermis powder of fish (so-called fish with shiny skin), or the like. In addition, sulfide of Zn or alkaline earth metal or the like is used as the luminous powder.

While a surface preparation treatment by which metal plating performed subsequently can be formed directly as glossy plating is performed in the previous polishing steps in the previous embodiments (FIG. 1 and FIG. 2), a polishing step (OP3-5) in this flow is to obtain gloss to improve the commercial value in the sprayed powder itself in this polishing step.

Accordingly, the polishing conditions have to be set to bring out gloss of the powder as a final product. The polishing surface pressure is set at a much lower value (30-50% surface pressure) than the surface pressure in the aforementioned previous polishing step, and the polishing speed is made higher (about 1.5 or more times higher).

Incidentally, conditions in steps OP3-1, 3-3 and 3-4 are almost the same as the conditions in the corresponding steps in the previous embodiments.

Figure 4:
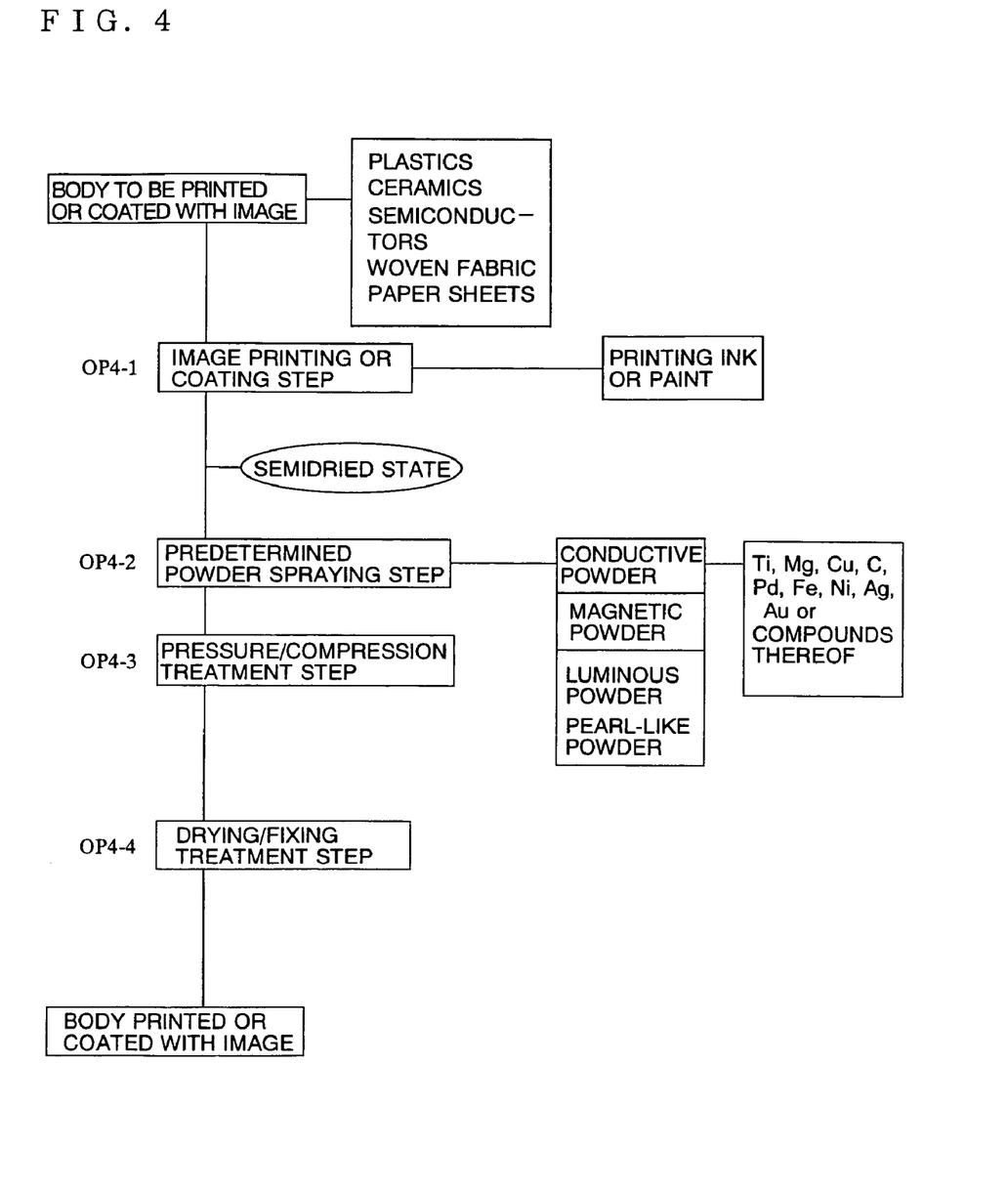
FIG. 4 is a flow chart showing Embodiment 4 of a method for creating a print or coating image on a plastic according to the present invention.

FIG. 4 is a flow chart showing a fourth embodiment of a method for creating a print or coating image according to the present invention.

In this flow, the polishing step is further omitted from the flow of the third embodiment (FIG. 3). This flow is applied to a product caring for no gloss and needing reflected light based on scattering of powder grains In addition, this embodiment is also suitable for a product needing an electromagnetic wave shielding effect which is a second object of the present invention, when the present invention is applied not only to an indication mark or pattern but also to all the surface or a specific wide area portion. Since the distribution density among the grains is enhanced by the pressure/compression step, the electromagnetic wave shielding effect is improved. Not to say, in this case, conductive powder or magnetic powder is used as the powder.

Figure 5:
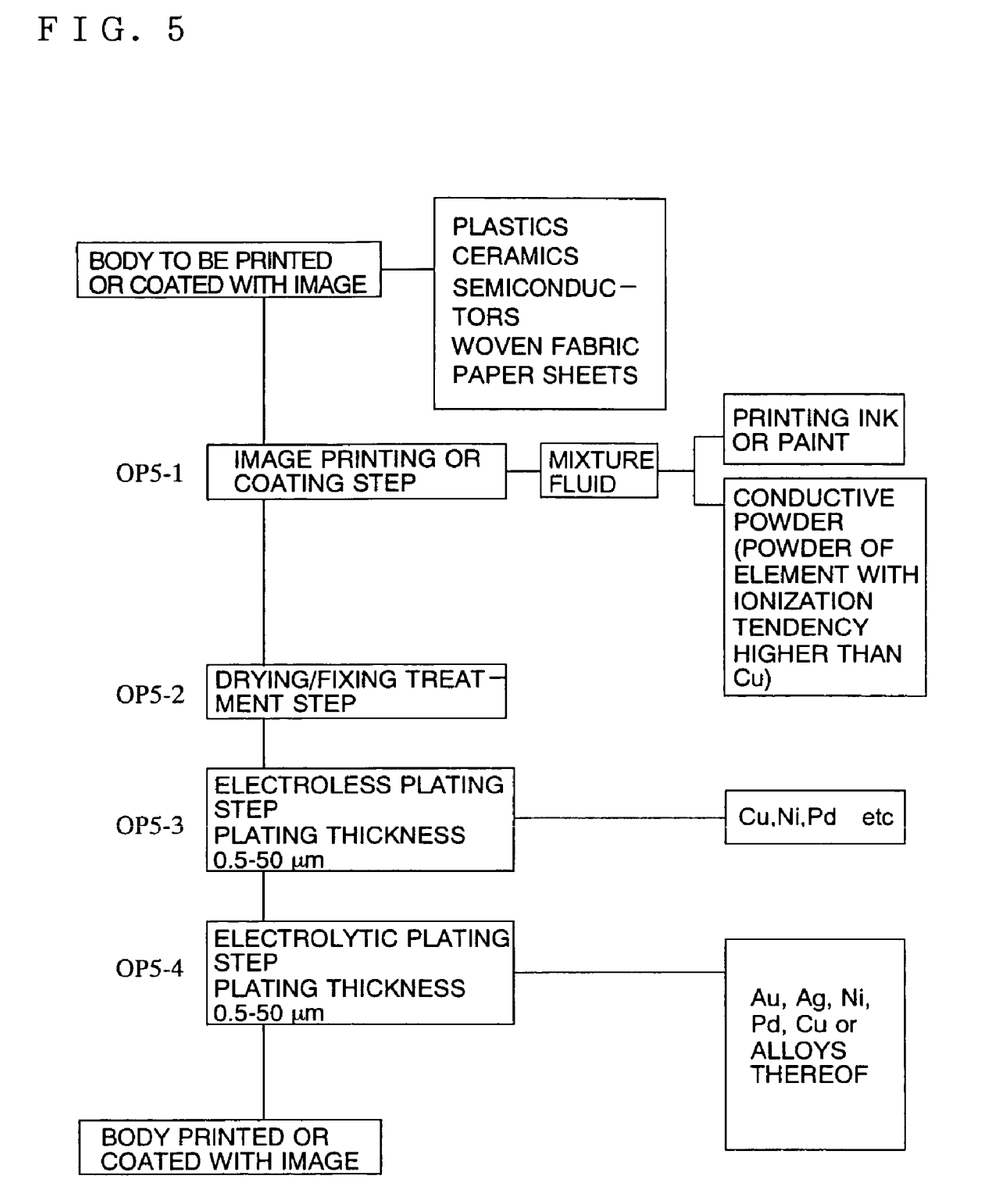
FIG. 5 is a flow chart showing Embodiment 5 of a method for creating a print or coating image on a plastic according to the present invention.

FIG. 5 is a flow chart showing a fifth embodiment of a method for creating a print or coating image according to the present invention.

This flow is characterized in that the pressure/compression step and the polishing step are omitted from the aforementioned flow, while thick electroless plating is performed instead to thereby improve the surface roughness such that subsequent electrolytic plating can serve as glossy plating. That is, as the electroless plating using a different in ionization tendency or the like, particularly electroless plating using Cu is preferred because it is so excellent in uniform electrodeposition performance that plating can be performed even in conditions comparatively poor in conductivity, and a comparatively large plating thickness can be obtained.

In electroless plating with Pd, Pd is deposited typically using a water solution of palladium chloride and tin chloride. In addition, when etching is slightly performed on the surface before the electroless plating, the adhesion can be improved.

When the plating thickness is set at 0.5-50 μm, the satin finished surface roughness of the conductive powder is improved to be not higher than 2 μm (Hmax). When the plating thickness is not larger than 0.5 μm, the degree of improvement in roughness will be insufficient, and there is an economic limit in 50 μm in the electroless plating.

In order to perform the electroless plating, the conductive powder forming the print or coating image has to be fundamentally powder of an element having a larger ionization tendency than that of the electroless plating element.

In addition, electrolytic plating with Au, Ag, Ni, Pd and a CU alloy can be performed easily through the electroless plating with Cu, Ni or Pd. In addition, the surface roughness obtained by this electrolytic plating can obtain allowable gloss without any polishing step. Not to say, the gloss can be further improved when a polishing step is performed after the electrolytic plating.

A print or coating image printing or coating step (OP5-1) and a drying/fixing step (OP5-2) in the flow conforms to the corresponding steps in the previous embodiments.

Figure 6:
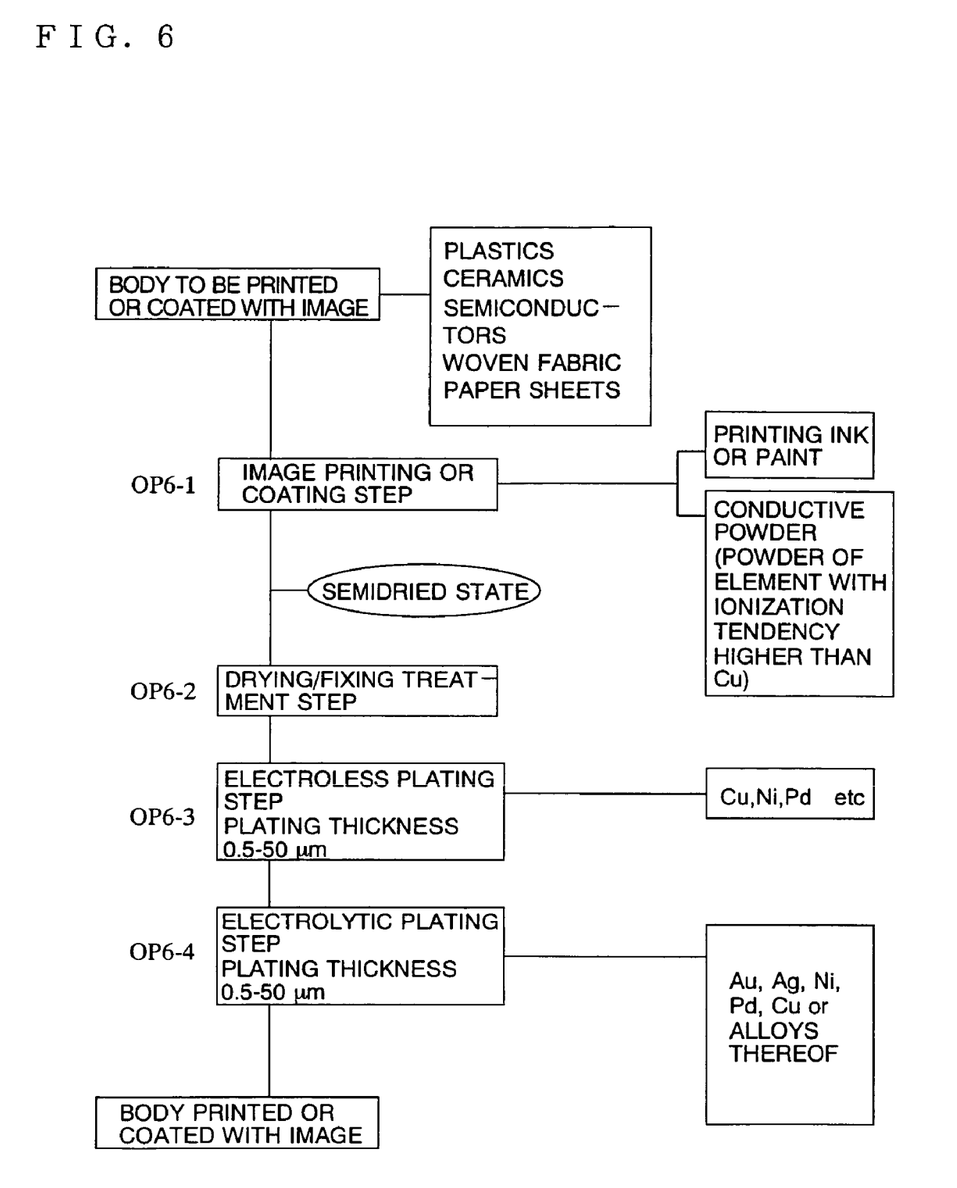
FIG. 6 is a flow chart showing Embodiment 6 of a method for creating a print or coating image on a plastic according to the present invention.

FIG. 6 is a flow chart showing a sixth embodiment of a method for creating a print or coating image according to the present invention.

This flow is characterized in that, in stead of the mixture fluid in the aforementioned print or coating image printing or coating step (OP5-1) in FIG. 5, a printing ink or paint is used for printing, and conductive powder is sprayed in the state where the printing or coating ink or paint is semidried (half-dried). Not to say, the conductive powder is powder of an element having a larger ionization tendency than the electroless plating element in the same manner as in FIG. 5.

EXAMPLE 1 body to be printed or coated with image: notebook-sized personal computer (material ABS)
indication mark: printed letters ("SHUHO", linewidth 3 mm, letter size 10×8 mm)
printing method printing by screen printing method
mixture printing ink (B: 20 vol %)
printing ink (A) standard ink for screen printing
conductive powder (B) Ti powder, Ag powder (vol ratio 30/70)
average grain size about 2 μm
pressure/compression treatment: pressure treatment with PTFE roller (load about 1 Kg, 3 rec.)
polishing treatment: polisher urethane sponge

| | |
|---|---|
| polishing surface pressure | about 50 g/cm$^2$ |
| polishing average speed | about 10 m/min. |
| number of reciprocation | 20 rec. | metal plating: Au electroplating (plating thickness 1 μm) number of trial products: 5

Figure 7:
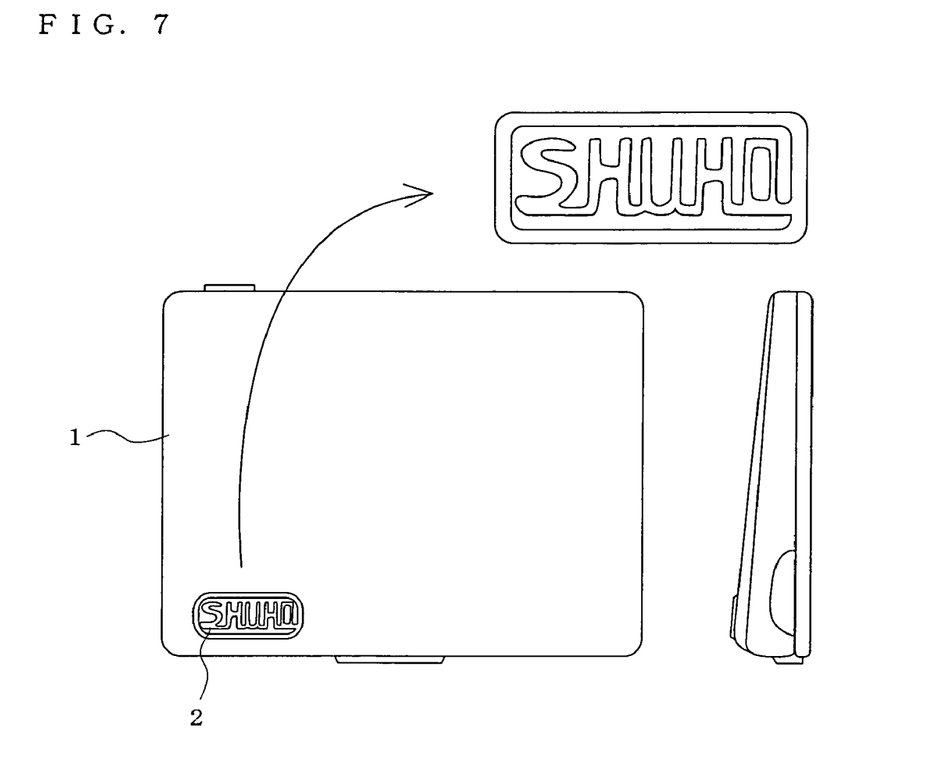
FIG. 7 is a schematic view of a notebook-sized personal computer with a print or coating image applied onto its surface according to Embodiment 1 of the present invention.

FIG. 7 is a schematic view of a notebook-sized personal computer in which a print or coating image carried out in Example 1 was expressed on the surface.

A very small amount of missing portions were recognized slightly in boundaries in the letter print image (SHUHO) after final metal plating, but the letter print image was displayed substantially as glossy gold plating satisfactory enough in terms of a commercial value. In addition, the adhesion of the plating was also estimated to be sufficient.

EXAMPLE 2 body to be printed or coated with image: eyeglass frame (material ABS)
indication mark: printed pattern (indeterminate pattern printed on frame surface, minimum line width 0.5 mm)
printing method printing on curved surface by pad printing method
printing ink standard ink for offset printing sprayed conductive powder: Ag powder (average grain size about 1 μm) sprayed by free fall with shifter immediately after printing pressure/compression treatment: pressure treatment on printed pattern portion with curved surface of PTFE plate (load about 5 Kg, 3 rec.), and then removal of excessive powder from the printed pattern portion by the air
heating/drying treatment: drying and fixing at 60° C. for 1 hr in hot air furnace
polishing treatment: polisher use of urethane sponge

| | |
|---|---|
| polishing surface pressure | about 50 g/cm$^2$ |
| polishing average speed | about 10 m/min. |
| number of reciprocation | 20 rec. | metal plating: Au electroplating (plating thickness about 1 μm) number of trial products: 10

Figure 8:
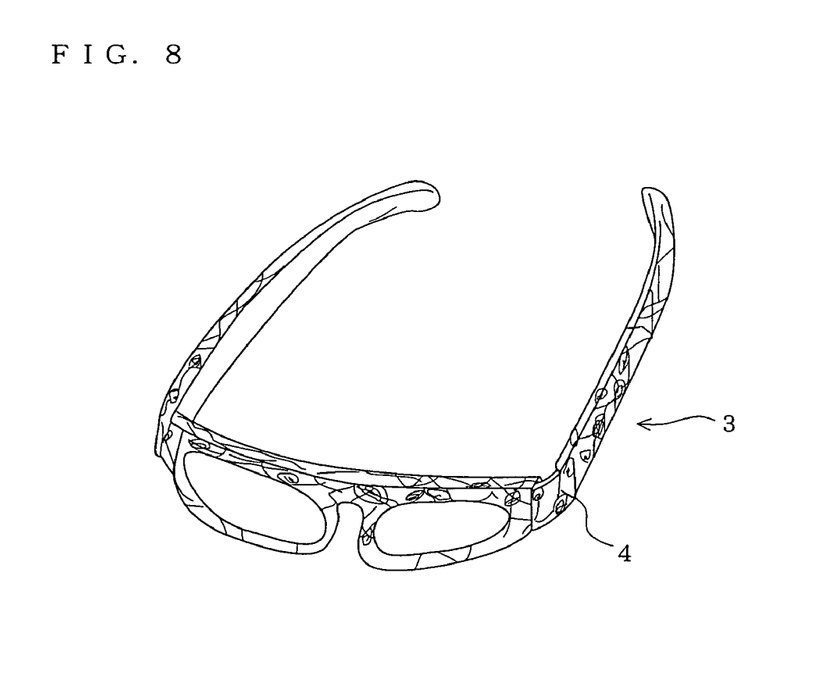
FIG. 8 is a schematic view of an eyeglass frame with a print or coating image applied onto its surface according to Embodiment 2 of the present invention.

FIG. 8 is a schematic view of an eyeglass frame in which a print image carried out in Example 2 was expressed on the surface.

Several very small defect portions (missing portions) were recognized in the plated narrowest line width portions in three of the ten trial products, but the total patterns of glossy gold plating were generally estimated to have a sufficient commercial value.

It was, however, determined that it was more preferable to reduce the load condition slightly in the pressure/compression treatment.

EXAMPLE 3 indication mark: printed pattern (astral marks)
  printing method printing on curved surface by pad printing method
  printing ink standard ink for offset printing sprayed powder: Au powder (average grain size about 1 μm) sprayed uniformly by free fall with shifter immediately after printing pressure/compression treatment: pressure treatment on printed pattern portion with curved surface of PTFE plate (load about 5 Kg, 3 rec.), and then removal of excessive powder from the printed pattern portion by the air
heating/drying treatment: drying and fixing at 60° C. for 1 hr in hot air furnace
polishing treatment: polisher use of urethane sponge

| polishing surface pressure | about 20 g/cm² |
| polishing average speed | about 20 m/min. |
| number of reciprocation | 30 rec. | number of trial products: 10

Figure 9:
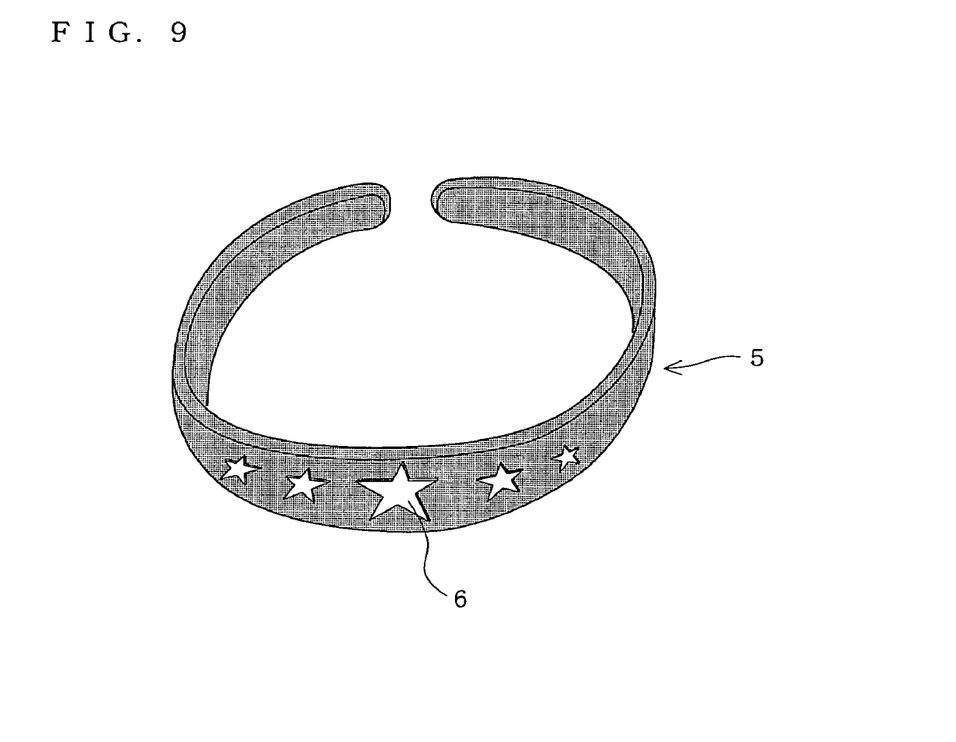
FIG. 9 is a schematic view of a wristband with a print or coating image applied onto its surface according to Embodiment 3 of the present invention.

FIG. 9 is a schematic view of a wristband in which a print image (astral marks) carried out in Example 3 was expressed on the surface.

The polishing surface pressure was reduced to about 20 g/cm², while the polishing speed was made about twice as high as that in the previous example. As a result, a gold pattern made of glossy gold powder emerged clearly only in any astral mark portion, and it was estimated to have a sufficient commercial value. In addition, the pattern boundaries were also clear without sagging.

EXAMPLE 4 body to be printed or coated with image: cellular phone casing (material ABS)
indication mark: printed pattern (all over the upper surface)
  printing method spraying
  paint acrylic-based paint
sprayed powder: Ag powder (average grain size about 1 μm) sprayed by free fall with shifter immediately after coating pressure/compression treatment: pressure treatment on the whole surface with curved surface of PTFE plate (load about 5 Kg), and then removal of excessive powder from the whole surface by the air
heating/drying treatment: drying and fixing at 60° C. for 1 hr in hot air furnace
number of trial products: 3 (Example 4) and 3 (without pressure/compression treatment)

Figure 10:
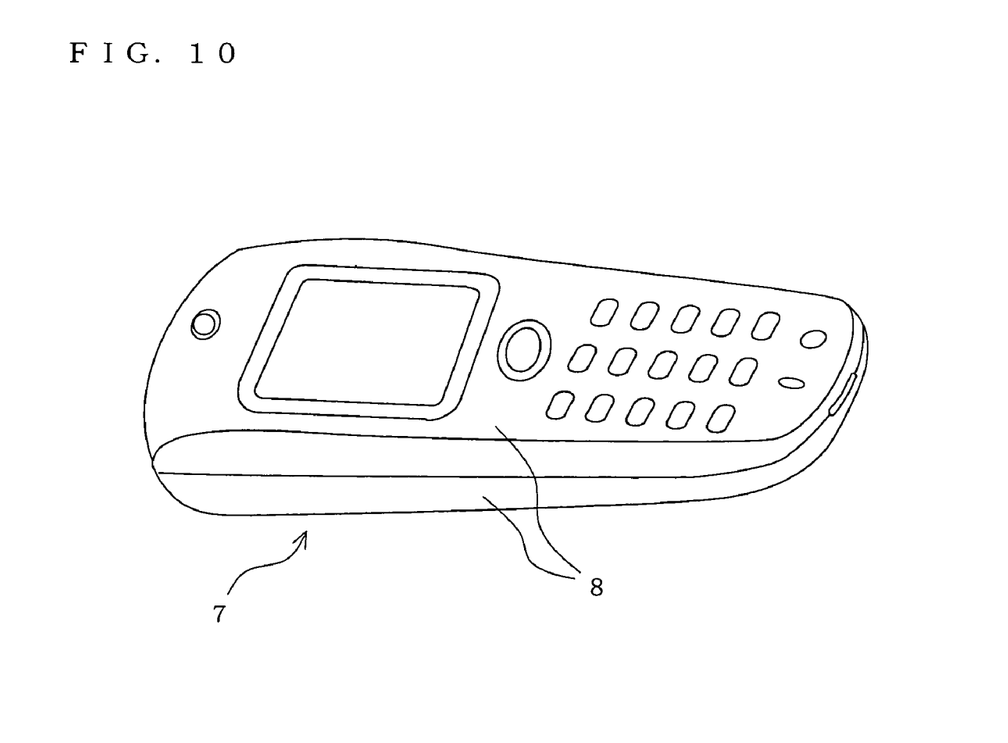
FIG. 10 is a schematic view of a cellular phone with a print or coating image applied all over its upper surface according to Embodiment 4 of the present invention.

FIG. 10 is a schematic view of a cellular phone in which a print image carried out in Example 4 of the present invention was expressed all over the upper surface.

Electric resistivity (average) all over the upper surface was measured and compared. The electric resistivity in each trial product according to Example 4 was improved on a large scale in comparison with that in each trail product subjected to no pressure treatment step.

Slight unevenness was recognized in the powder distribution, but each trial product showed dull silver white as a whole and had a satisfactory appearance.

When the present invention is applied to plastic toys, toys (e.g. various plastics, robots, etc.) with marks or patterns expressing dreams by glossy plating can be provided inexpensively.

In addition, when conductive powder or magnetic powder is selected in the present invention, not only is it possible to obtain glossy metal plating in an indication mark or image, but it is also possible to provide a product having an electromagnetic wave shielding effect and a photocatalyst effect together.

In the background art, it has been regarded as impossible to perform electrolytic plating with metal upon ordinary plastic such as ABS material. However, according to the present invention, such electrolytic plating can be obtained inexpensively and in a form of having gloss without performing any treating means after the plating, as described above.

Figure 11:
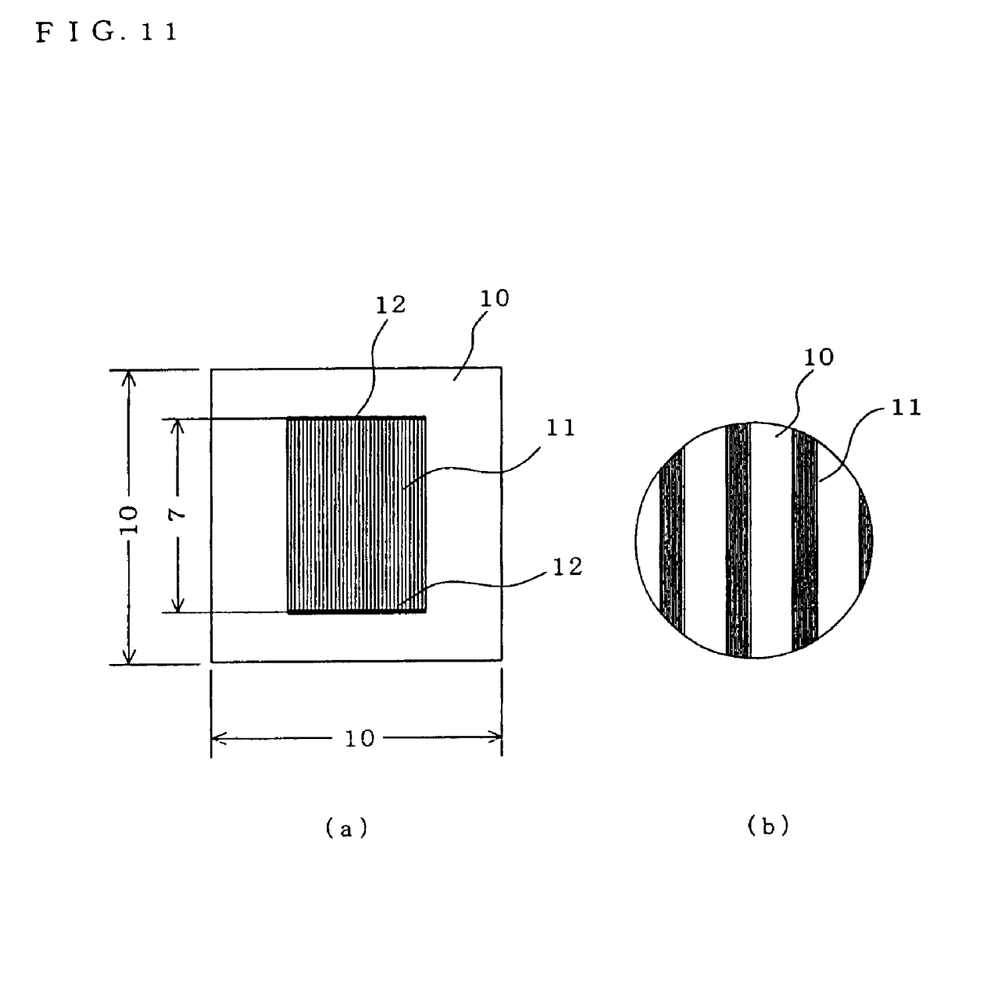

EXAMPLE 5:

FIGS. 11 are explanatory views of this Example 5, (a) being an explanatory view of an upper surface of a specimen applied with a print image, (b) being a partially enlarged explanatory view of the print image.

In FIGS. 11, the reference numeral 10 represents a ceramic plate; 11, a simulated printed circuit; and 12, a connection portion. Incidentally, the specification of the specimen will be shown below. body to be printed or coated with image: simulated printed circuit device
  (material Si-based ceramics plate measuring 10 mm by 10 mm by 0.5 mm)
simulated circuit specification:
  printing contents circuit offset-printed as in FIG. 11
    (measuring 7 μm in wire width by 7 mm in length by 10 μm in inter-wire interval by 300 lines in number of wires)
  printing ink standard ink for offset printing sprayed powder: Pd powder (average grain size about 1 μm) sprayed uniformly by free fall with shifter immediately after printing pressure/compression treatment: pressure treatment on printed pattern portion with curved surface of PTFE plate (load about 5 Kg, 3 rec.), and then removal of excessive powder by turning over heating/drying treatment: drying and fixing at 60° C. for 1 hr in hot air furnace
polishing treatment: polisher use of urethane sponge

| polishing surface pressure | about 20 g/cm² |
| polishing average speed | about 20 m/min. | number of trial products: 3 (specimens in this Example)

3 comparative products (printed in the aforementioned specification using mixture fluid in which 30 vol % of Pd powder (average grain size about 1 μm) was mixed into the standard ink for offset printing)

While each comparative product was insufficient in electric continuity, perfect continuity was recognized in all the three trial products in this Example. Although a variation of about ±1 μm was recognized with respect to the intended wire width 7 μm, the variation was estimated to be substantially within an allowable range.

Electroless Cu plating (plating thickness about 3 μm) in usual conditions was performed on trial upon the aforementioned specimens subjected to the polishing treatment. It was confirmed that the wires were coated with Cu plating substantially uniformly. No defect such as bridge or the like caused by plating was recognized.

EXAMPLE 6 body to be coated with image: silk woven fabric (1,000 deniers, measuring 100 mm by 100 mm)
coating conditions:
  paint UV-curing paint
  coating method whole surface coated by spraying method (coating thickness about 0.03 mm (estimated))
sprayed powder: Pd powder (average grain size about 1 μm) sprayed uniformly by free fall with shifter immediately after printing, and then removal of the remaining powder by inversion (layer thickness about 40 μm)
pressure treatment: compression/pressure treatment with PTFE roller (load about 5 Kg, 3 rec.)

The surface of the coated silk woven fabric in this Example showed a surface of perfect electric continuity, but flexibility was lost on a large scale so that it was estimated to have some defect impractical use. It is therefore desired to apply not coating all over the surface but partial printing using a printing method within an electric continuity range.

Incidentally, the aforementioned each Example was described as to its fundamental steps. Each Example is not intended to prevent any supplementary process from being additionally performed in each step or between steps. In addition, each Example was described about one example in conditions corresponding thereto. Various conditions in each Example is not limited to the aforementioned range described in the Example.

According to the present invention, an indication mark or image with gloss can be performed upon a plastic product or the like inexpensively by the aforementioned first to third steps in claim 1 or the aforementioned first to sixth steps in claim 2 or by specific means of claims 3 to 8. In addition, an effect as a measure to shield electromagnetic waves can be expected.

Further, due to these steps, various products applied with fashionable images or glossy indication marks or patterns together with the electromagnetic wave shielding effect can be expected more surely and inexpensively. In addition, various products with good electric continuity using a printing method can be provided.

INDUSTRIAL APPLICABILITY

As described above, a method for creating a print or coating image on the surface of a to-be-printed or to-be-coated product according to the present invention is applicable to products in any field. The method for creating a coating image on the surface can apply a fashionable or glossy indication mark or image onto the surface of any product in any field inexpensively, and can support social needs over a wide range expecting an inexpensive measure to shield electromagnetic waves.

The invention claimed is:

1. A method for creating a print image on a surface of a to-be-printed product, said print image creating method being characterized by comprising a first step of printing said surface of said to-be-printed product with a predetermined print image using a mixture fluid in which predetermined powder has been mixed into printing ink, a second step of pressure-treating and polishing at least said printed or coated print image surface in predetermined conditions in a state to prevent treatment dust from being produced, or polishing at least said printed or coated print image surface in predetermined conditions in a state to prevent treatment dust from being produced, and a third step of further plating said print image surface polished in said state to prevent treatment dust from being produced.

2. A method for creating a print image on a surface of a to-be-printed product, said print image creating method being characterized by comprising a first step of printing said surface of said to-be-printed product with a predetermined print using printing ink, a second step of spraying said printed surface with predetermined powder before said printed surface is hardened, a third step of further pressure/compression-treating said print image surface, a fourth step of drying and fixing said print image surface, a fifth step of pressure-treating and polishing said print image surface in predetermined conditions in a state to prevent treatment dust from being produced, or polishing said print image surface in predetermined conditions in a state to prevent treatment dust from being produced, and a sixth step of further plating said print image surface polished in said state to prevent treatment dust from being produced.

3. A print image creating method according to claim 1 or 2, characterized in that said predetermined powder is made of at least one kind of conductive powder, magnetic powder, luminous powder and pear-like powder.

4. A print image creating method according to claim 1 or 2, characterized in that said predetermined powder is made of at least one kind selected from a group of Ti, Cu, Fe, Ni, Mg, C, Pd, Ag and Au or a group of compounds of those, and an average grain size of said predetermined powder is 0.5-10 μm.

5. A print image creating method according to any one of claims 1 through 4, characterized in that said plating is electrolytic plating, or electroless plating and electrolytic plating.

6. A print image creating method according to any one of claims 1, 2 and 4, characterized in that said plating is plating with at least one kind selected from Au, Ag, Ni, Pd, Cu and alloys of those, and thickness of said plating is 0.2-50 μm.

7. A print image creating method according to any one of claims 1 through 6, characterized in that said polishing in said state to prevent treatment dust from being produced is performed enough times to generate a gloss in said surface with a surface pressure of 20-100 g/cm$^2$ and an average polishing speed of 5-20 m/min and by use of not polishing material but sponge, felt, cotton cloth or leather as said predetermined conditions of said polishing.

8. A print image creating method according to any one of claims 1 through 7, characterized in that said to-be-printed product is made of plastics, ceramics, semiconductor, fiber or paper.

* * * * *